United States Patent
Negishi et al.

(10) Patent No.: US 7,371,690 B2
(45) Date of Patent: May 13, 2008

(54) DRY ETCHING METHOD AND APPARATUS

(75) Inventors: Nobuyuki Negishi, Tokyo (JP); Masaru Izawa, Tokyo (JP); Kenetsu Yokogawa, Tsurugashima (JP)

(73) Assignee: Hitachi High-Technologies Corporation, Tokyo (JP)

( * ) Notice: Subject to any disclaimer, the term of this patent is extended or adjusted under 35 U.S.C. 154(b) by 181 days.

(21) Appl. No.: 10/924,983

(22) Filed: Aug. 25, 2004

(65) Prior Publication Data
US 2005/0048787 A1    Mar. 3, 2005

(30) Foreign Application Priority Data
Aug. 28, 2003 (JP) ............... 2003-303961

(51) Int. Cl.
*H01L 21/461* (2006.01)
*H01L 21/302* (2006.01)

(52) U.S. Cl. ............... 438/714; 438/717; 438/725
(58) Field of Classification Search ............... None
See application file for complete search history.

(56) References Cited
U.S. PATENT DOCUMENTS
5,804,088 A * 9/1998 McKee ............... 216/47
6,117,786 A * 9/2000 Khajehnouri et al. ....... 438/700
6,159,862 A * 12/2000 Yamada et al. ............. 438/712
7,022,611 B1 * 4/2006 Keil et al. .................. 438/706
2002/0048019 A1* 4/2002 Sui et al. .................... 356/369
2003/0000920 A1* 1/2003 Lee .............................. 216/41

* cited by examiner

*Primary Examiner*—Duy-Vu N Deo
(74) *Attorney, Agent, or Firm*—Antonelli, Terry, Stout & Kraus, LLP.

(57) ABSTRACT

A condition without using Ar as plasma gas is applied to processing of an organic anti-reflection-coating, which suppresses a spatter effect and decreases the cleavage of C—H and OC—O bonds in a resist. As a result, roughness of the resist after processing the anti-reflection-coating can be suppressed, and pitting and striations after processing a next film to be processed, that is an insulating film, can be prevented. For a rare gas to be used at the time of processing the insulating film, any one of Xe, Kr, a mixed gas of Ar and Xe, and a mixed gas of Ar and Kr is applied in place of Ar, giving rise to reduction in pitting and striations after etching. In addition, a dry etching method with less critical-dimension shift and excellence in both apparatus cost and throughput can be provided by performing resist modification and etching by turns.

14 Claims, 10 Drawing Sheets

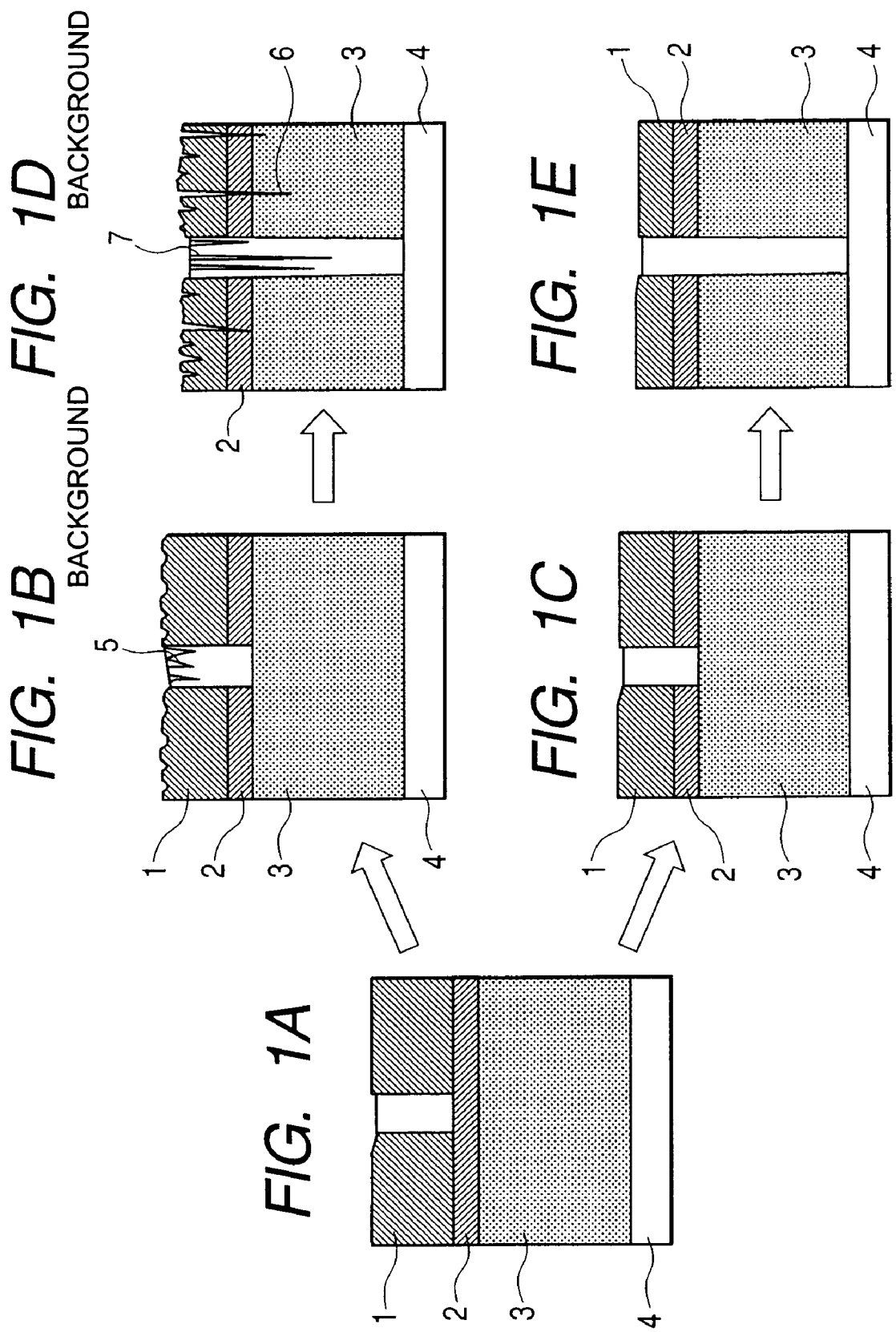

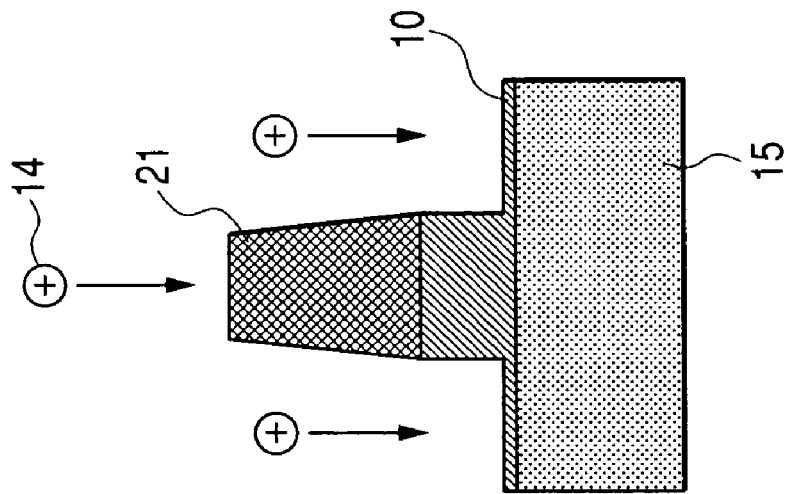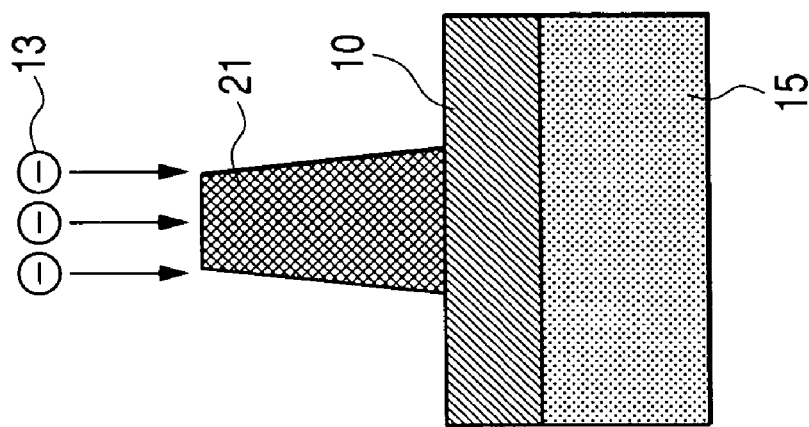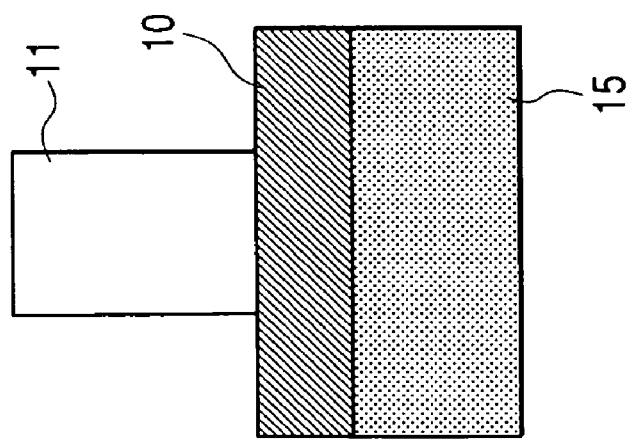

DRY ETCHING METHOD AND APPARATUS

CLAIM PRIORITY

The present application claims priority from Japanese application JP 2003-303961, filed on Aug. 28, 2003, the content of which is hereby incorporated by reference into this application.

FIELD OF THE INVENTION

The present invention relates to a dry etching apparatus of the type used for etching an inter-layer-dielectric among dry etching processes and to a dry etching method; and, the present invention relates particularly to a method in which resist damage can be reduced in via etching, high-aspect-ratio contact etching, self-align-contact etching, trench etching, damascene etching, gate mask etching, and the like using a resist pattern for ArF lithography or later lithography.

BACKGROUND OF THE INVENTION

In a semiconductor device, the electrical connection between a transistor formed on a wafer and metal wiring and between metal wirings is established first by making contact holes on an inter-layer dielectric, that is formed on the upper part of the transistor structure and between wirings, by a dry etching method with the use of plasma, and then by filling a semiconductor or a metal in the contact holes. Particularly for the production of a high-density and high-speed logic device beyond the 90 nm-node, the damascene process, in which trenches and vias are formed by etching an inter-layer-dielectric made of a low dielectric-constant, or low-k, material by a dry etching method, followed by filling the trenches and vias with Cu as a wiring material, and ArF lithography with a 193 nm light source for a finer pattern formation are being used. The dry etching method is a technology by which a mask material represented by a resist is etched and a layer to be processed is etched selectively for providing a wiring layer and base substrate underlying the vias and the contact holes. This method comprises generating plasma from an etching gas introduced into a vacuum chamber with high frequency power applied externally and allowing reactive radicals and ions generated in the plasma to react with the layers on the wafer with high precision.

In general, when a wiring pattern is formed for a semiconductor circuit, an organic bottom-anti-reflection coating (BARC) is formed on the film to be processed, and a resist film is further formed thereon. The BARC is used to prevent an abnormal pattern, caused by interference of laser light serving as a light source for lithography, from being formed. After forming a resist pattern, the BARC is etched, and then the film to be processed is etched (main etching). Since the BARC is made of a material rich in C, similar to the resist, etching of the BARC is carried out by forming a plasma from an introduced mixed gas consisting of a fluorocarbon gas rich in F, such as $CF_4$ or $CHF_3$, a rare gas represented by Ar, and oxygen gas in a pressure range of from 0.5 Pa to 10 Pa, and by controlling the ion energy incident on the wafer in a range of 0.1 kV to 1.0 kV.

The formation of vias and contact holes is carried out by forming plasma from an introduced mixed gas consisting of a fluorocarbon gas such as $CF_4$, $CHF_3$, $C_2F_6$, $C_3F_6O$, $C_4F_8$, $C_5F_8$, and $C_4F_6$, a rare gas represented by Ar, oxygen gas, CO gas and the like serving as a plasma gas in a pressure range of from 0.5 Pa to 10 Pa, and accelerating ion energy incident on the wafer up to 0.5 kV to 2.5 kV.

In the etching process described above, the resist materials for ArF or later lithography present problems in that the resist etching rate is larger and the surface roughness due to resist damage is more serious compared to those for conventional KrF resist and i-line resist.

Since the etching resistance of KrF resist was sufficiently high compared to that of ArF resist and the device density was not so high for the former, there was no major concern for striation and line-edge-roughness. However, the deterioration of the line-edge roughness due to resist roughness after etching exerts a great influence on the device characteristics. This is particularly so in etching requiring final dimensional accuracy, such as hard mask etching represented by $SiO_2$ for gate electrode formation and SiN mask etching used as a mask for a shallow-trench-isolation process. Further, etching of a low-k material (SiOC film) that is an inter-layer-dielectric, the introduction of which is being pursued for the production of a high-density logic device, is carried out by high-energy ion irradiation using a relatively high bias and in an atmosphere of gas rich in $O_2$. Therefore, striations occur on the pattern sidewalls, and, in addition, pitting of the resist occurs, which is a phenomenon involving the local appearance of holes on unpatterned portions.

SUMMARY OF THE INVENTION

Hence, the present invention takes as its object the provision of a dry etching method in which the etching resistance of a resist is ensured in an etching process using a resist of ArF or a later lithography generation as a mask, as well as and an etching apparatus to effectuate the present method.

The present specification discloses at least three features of the invention.

In accordance with a first feature of the present invention, a plasma gas with a flow ratio of Ar that is not more than 10% relative to the total plasma gas flow (preferably 0%) is used as the plasma gas for etching an organic anti-reflection-coating or a portion of a layer to be processed in an etching process using a resist material, such as ArF resist, that is lower in etching resistance compared to conventional resist materials, thereby solving the above-material problem.

In accordance with a second feature of the present invention, resist modification and etching are carried out in the same etching apparatus, and the etching is performed while modifying the resist, thereby solving the above-mentioned problem.

In accordance with a third feature of the present invention, gases such as Xe and Kr having a lower ionization energy compared to Ar, which is conventionally used as a dilution gas, are used as the dilution gas or added to Ar, thereby solving the above-mentioned problem.

According to the present invention, resist damage, which typically presents a problem in pattern formation using a resist of ArF or later lithography generation that is less resistant to etching, can be efficiently prevented, and pitting and striations due to resist damage can be improved. Furthermore, application of the method and apparatus, in which resist modification and etching are carried out by turns, provides an improvement in apparatus cost and throughput as well as a contribution to the enhancement of productivity compared to the case where the resist modification is performed in a standalone apparatus.

BRIEF DESCRIPTION OF THE DRAWINGS

FIGS. 1A to 1E are diagrams which depict a process used to form contact holes using as a mask a resist pattern formed by lithography with an ArF excimer laser as a light source, wherein FIG. 1A is a cross sectional view of a sample before processing; FIG. 1B is a cross sectional view of a case where a conventional etching process is applied to BARC processing; FIG. 1C is a cross sectional view of a case where an etching process according to a first embodiment of the present invention is applied to the BARC processing; FIG. 1D is a cross sectional view of a case where a conventional etching process is applied to a silicon oxide film after the BARC processing shown in FIG. 1B; and FIG. 1E is a cross sectional view of a case where the etching process according to the first embodiment of the present invention is applied to the silicon oxide film after the BARC processing shown in FIG. 1C.

FIGS. 2A to 2C represent SEM photographs when an ArF resist is etched under various conditions, wherein FIG. 2A is a cross sectional view of the ArF resist when a gas of $CF_4$ alone is used for plasma; FIG. 2B is a cross sectional view of the resist when a mixed gas of Ar and $CF_4$ is used for plasma and a radio-frequency bias power is set to 0.32 $W/cm^2$; and FIG. 2C is a cross sectional view of the resist when the same gas condition as that in FIG. 2B is used and the radio-frequency bias power is set to 0.64 $W/cm^2$.

FIGS. 4A to 4C are diagrams of CF polymer deposited on the resist surface depending on rare gas species, wherein FIG. 4A depicts deposits when He is used; FIG. 4B depicts deposits when Ar is used; and FIG. 4C depicts deposits when Xe is used.

FIGS. 5A to 5E are diagrams which depict a process used to carry out resist modification and etching by turns according to the present invention, wherein FIG. 5A is a cross sectional view before the processing; FIG. 5B is a cross sectional view when a first resist modification is performed; FIG. 5C is a cross sectional view showing when a first etching of an anti-reflection-coating is performed; FIG. 5D is a cross sectional view showing when a second resist modification is performed; and FIG. 5E is a cross sectional view showing when a second etching of the anti-reflection-coating is performed.

FIGS. 6A to 6C are diagrams which depict a critical-dimension shift caused by a conventional process for the resist modification, wherein FIG. 6A is a cross sectional view of an initial shape of a resist; FIG. 6B is a cross sectional view of the resist reduced in lateral dimension after the resist modification, and FIG. 6C is a cross sectional view of the resist having the critical-dimension shift after etching.

FIG. 8A shows incident current and FIG. 8B shows acceleration voltage.

DETAILED DESCRIPTION OF THE PREFERRED EMBODIMENTS

Figure 2A:
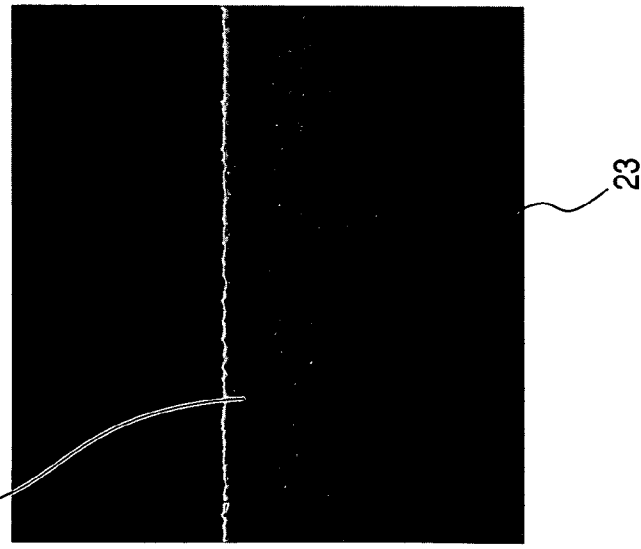

In the etching process using a resist for ArF or later lithography generation as a mask, there are two kinds of conceivable methods to ensure etching resistance of the resist.

A first method is one in which ion sputtering components contained in an etching gas are reduced to such a degree that striations and large line-edge-roughness are not generated.

The reason why etching resistance of an ArF resist material differs from that of a conventional resist material (for example, KrF resist material) is as follows: In the ArF resist, no benzene nucleus exists, but many carbonyl groups (C═O bonds) are present, which is different from the conventional resist. To the carbonyl groups, a bulky etch-inhibiting group, such as an adamantly group, is bonded. The bond of OC—O is unstable because of the small binding energy. Therefore, the group is readily eliminated by being attacked by ions, electrons, and the like that are sputtered on the resist surface during etching. As a result, the main chains of the resist, mainly composed of C—C bonds, remain locally and selectively. This acts as a micro mask, giving rise to deterioration in the surface roughness. Accordingly, when ion sputtering components contained in the etching gas are sufficiently reduced, C—H bonds and OC—O bonds become difficult to be cleaved, which can result in a decrease in the generation of striations and large line-edge-roughness to a degree that there is no problem in a practical use.

"The expression ion sputtering component contained in an etching gas" means, for example, Ar gas in the conventionally used etching gas (e.g., a mixed gas of fluorocarbon gas, Ar, oxygen gas, and CO gas).

It should be noted that the flatness of the resist surface can be further improved by treating the resist surface with a gas containing F and H at the same time or after etching. This is because the dangling bonds of the carbons left behind in the cleaved carbonyl groups are terminated with F and H, suppressing the generation of C═C bonds at the position. Further, roughness of the resist surface is suppressed by removing the micro mask that remains on the surface layer and is mainly composed of C═C bonds and is rich in C after bottom-anti-reflection-coating (BARC) etching. Still further, striations and pitting resulting from resist deterioration amplified during etching can be reduced by suppressing C-radicals and O-radicals in the plasma during the process of main etching after the BARC etching.

A second method involves modification of a resist. However, the modification of a conventional resist is performed on an EB curing system, and then a wafer is transferred to an etching apparatus for its etching treatment, which heretofore has been disadvantageous in view of production cost and improvement in throughput. In addition, since electron beams of high energy (ca. 4 keV) have been irradiated to fully cure the whole resist, there has been a fear of damaging the wafer. Hence, the second method is characterized in that the resist modification and etching are carried out by turns in the same etching apparatus and etching is carried out while modifying the resist.

According to the present method, the thickness of the resist film to be cured in one cycle is small, and, therefore, it is possible to lower the acceleration energy of the electron beams irradiated for the modification and to reduce damage to the wafer. Furthermore, the throughput can be enhanced and the production can be improved compared to a case in which surface modification of a resist is performed in a standalone apparatus.

First Embodiment

FIGS. 1A to 1E are cross sectional views to show a process of forming contact holes using as a mask a resist pattern formed by lithography with the use of an excimer laser as a light source. FIG. 1A shows an example of a sample to which the dry etching method of the present embodiment is applied. The film structure is composed of a resist 1 applicable to ArF lithography, an organic bottom-anti-reflection-coating (BARC) 2 that suppresses an abnormal pattern formation due to interference of laser reflection, a silicon oxide film 3 that is a film to be processed, and a base silicon substrate 4. Here, the film thickness of the resist applicable to the ArF lithography was set to 350 nm, and that of the BARC was set to 60 nm. It should be noted that an open portion at the center of the resist 1 in each of FIGS. 1A to 1E shows the inner wall of the contact hole.

FIGS. 1B and 1D are cross sectional views which show the result when a conventional etching process was applied to the sample shown in FIG. 1A. FIGS. 1C and 1E are cross sectional views which show the result when the etching process in accordance with the present embodiment was applied to the sample shown in FIG. 1A.

First, BARC processing is carried out by plasma etching. A mixed gas of Ar and $CF_4$ was used for BARC processing in KrF lithography generation prior to ArF lithography generation. The etching conditions for this were, for example, gas flows of Ar=500 ml/min and $CF_4$=125 ml/min and a pressure of 2 Pa. The partial pressure of $CF_4$ was controlled by adding Ar, and a vertical shape was achieved in the BARC processing. FIG. 1B depicts a case in which these conditions were applied to a resist of the ArF lithography generation. Although there was no problem for a KrF resist, a roughness of several tens of nm appeared on the surface of the ArF resist, and striations 5 that constitute vertical streaks were generated on the sidewall of the resist hole, particularly in a dense pattern portion. FIG. 1C shows an example in which Ar-less process conditions, that are processing conditions of the present invention, were applied. In this case, $CF_4$ was supplied at 100 ml/min to 500 ml/min, and the pressure was 2 Pa to 10 Pa. In addition, a radio-frequency bias power applied to the semiconductor substrate was set to 0.32 W/cm$^2$. The use of these conditions eliminated the incidence of Ar ions that are high in sputtering efficiency and suppressed cleavage of C—H bonds and OC—O bonds in the resist, thereby eliminating roughness of the resist surface and striations 5 on the sidewall of the resist pattern, which differs from that shown in FIG. 1B. Here, it can be seen that the non-use of Ar in the plasma gas and a lower radio-frequency bias applied to the semiconductor substrate are important in suppressing ArF resist damage.

Figure 2B:
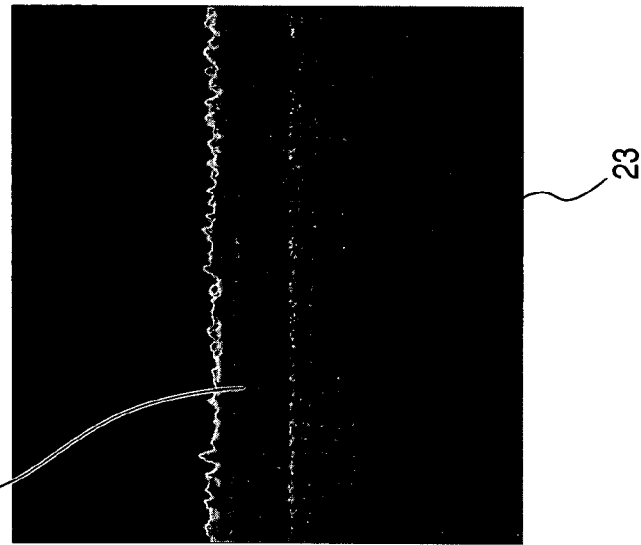
Figure 2C:
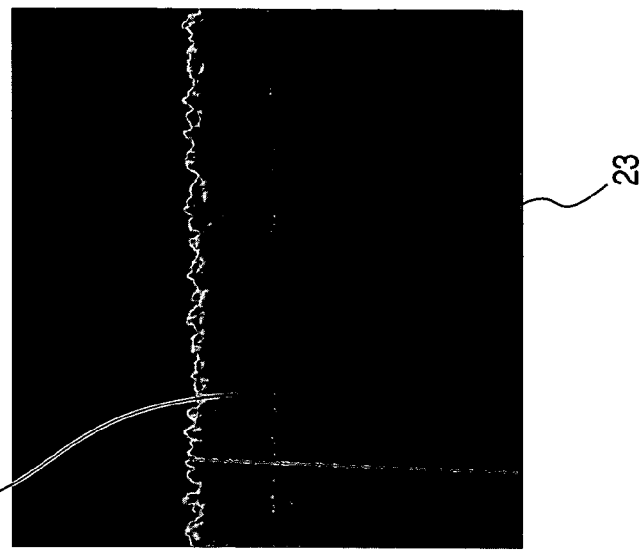

FIG. 2A is a photograph by a SEM (scanning electron microscope) showing the state of the ArF resist when a gas of $CF_4$ alone was used for plasma and a radio-frequency bias power was set to 0.32 W/cm$^2$. FIG. 2B is a SEM photograph showing the state of the ArF resist when a mixed gas of Ar and $CF_4$ was used for plasma and the radio-frequency bias power was set to 0.32 W/cm$^2$. FIG. 2C is a SEM photograph of a state of the ArF resist when the same gas condition as that in FIG. 2B was used and the radio-frequency bias power was set to 0.64 W/cm$^2$. From these observations, it is apparent that the ArF resist surface in FIG. 2A is the smoothest where Ar gas was not used and the radio-frequency bias was depressed. Although not shown, the generation of roughness on the resist surface was confirmed when the radio-frequency bias power was set to 0.5 W/cm$^2$ or higher even under the condition that argon gas was not used in the present BARC processing.

Next, etching of the silicon oxide film, that is a film to be processed, is carried out using the ArF resist as a mask after the BARC processing shown in FIGS. 1B and 1C. A mixed gas of Ar, $C_4F_6$, $O_2$, and CO is used for the etching condition. Specifically, for example, Ar is supplied at 300 ml/min to 2,000 ml/min, $C_4F_6$ at 20 ml/min to 70 ml/min, $O_2$ at 25 ml/min to 100 ml/min, and CO at 0 ml/min to 300 ml/min. At that time, the pressure is set to 1 Pa to 10 Pa.

FIG. 1D is a cross sectional view showing the result when the silicon oxide film described above was processed after the BARC processing shown in FIG. 1B. The roughness of the resist surface that was several tens of nm after the BARC processing was amplified by processing the silicon oxide film, and micro holes were formed even on the portion of the resist without any pattern, reaching the silicon oxide film, that is a film to be processed, through the BARC. Hereinafter, this will be referred to as pitting 6. In addition, striations 7 are generated on the sidewall of the pattern, which is a reflection of the vertical streaks on the resist portion. The condition of processing this silicon oxide film employs a fluorocarbon gas with a high ratio of C to F, such as $C_4F_6$ and CO gas to increase the resist selectivity. Therefore, when there is any minute roughness on the resist surface before processing the silicon oxide film, the resist surface cannot be sufficiently covered with polymer, since CF polymer film materials during etching are relatively rich in C. Thus, minute dent portions have less polymer and allow etching to proceed more readily, thereby producing pitting. Moreover, an effective amount of the polymer itself is particularly less at the sidewall portion of a pattern due to the influence of sputtering of incident ions, and the availability of the polymer becomes critical depending on the locations, resulting in a tendency of generating striations.

On the other hand, FIG. 1E is a cross sectional view showing the state after processing the silicon oxide film using the mask shown in FIG. 1C. In the present condition, there is very little roughness on the resist surface before processing the silicon oxide film. Therefore, even under the present processing condition of the silicon oxide film, in which the CF polymer quantity during etching is high, there is little difference in availability of the polymer depending on location, resulting in little deterioration of the resist. Accordingly, the occurrence of the pitting and striations, as shown in FIG. 1D, can be suppressed.

The present example was directed to the use of $CF_4$ alone as a condition of the BARC processing gas, however the gas is not limited to $CF_4$ alone. Gases that can supply O-radicals and F-radicals, such as $O_2$, $SF_6$, and $NF_3$ may be added to a gas represented by $C_xH_yF_z$ (x, z=1 to 10, y=0 to 10) such as $CF_4$. In this case, the damaged layer rich in C that is produced by cleavage of C—H bonds and OC—O bonds contained in the resist is removed by the O-radicals and F-radicals, thereby allowing suppression of the resist damage after the BARC processing.

The fluorocarbon gas contained in the processing gas is better when the number of C in $C_xH_yF_z$ is as small as possible (x=1, y=0 to 10, z=1 to 10). When the material of the layer to be processed is an inorganic insulating material with a low dielectric constant (for example, SiOC), it often contains a C-component, such as $CH_3$. Accordingly, when the proportion of C-content in the fluorocarbon gas is small, it is possible to suppress etching stop as well as to reduce resist damage. For the processing gas, at least one kind of the gases consisting of $N_2$, $O_2$, $SF_6$, $NF_3$, $H_2$, and $CH_4$ is mixed with a fluorocarbon gas and used.

The dry etching method and dry etching apparatus according to the present invention are characterized in that a gas containing iodine is added to etch the layer to be processed as described above. A modified effect of the extreme surface layer of the resist can be obtained by allowing an iodine ion having a heavy mass to enter the resist surface during etching.

Furthermore, even if resist damage occurs after the BARC processing, as shown in FIG. 1B, the resist damage formed after the BARC processing can be removed by supplying O-radicals, F-radicals, and N-radicals by means of plasma generated by $O_2$, $SF_6$, $NF_3$, and the like. In this way, even when a subsequent processing of the silicon oxide film is performed, an effect similar to that described above can be obtained.

The following explanation is focused on etching conditions at the time of processing the silicon oxide film. It is needless to say that the BARC etching conditions described above are also desirably applied to the BARC etching in the embodiment to be explained below.

Figure 3:
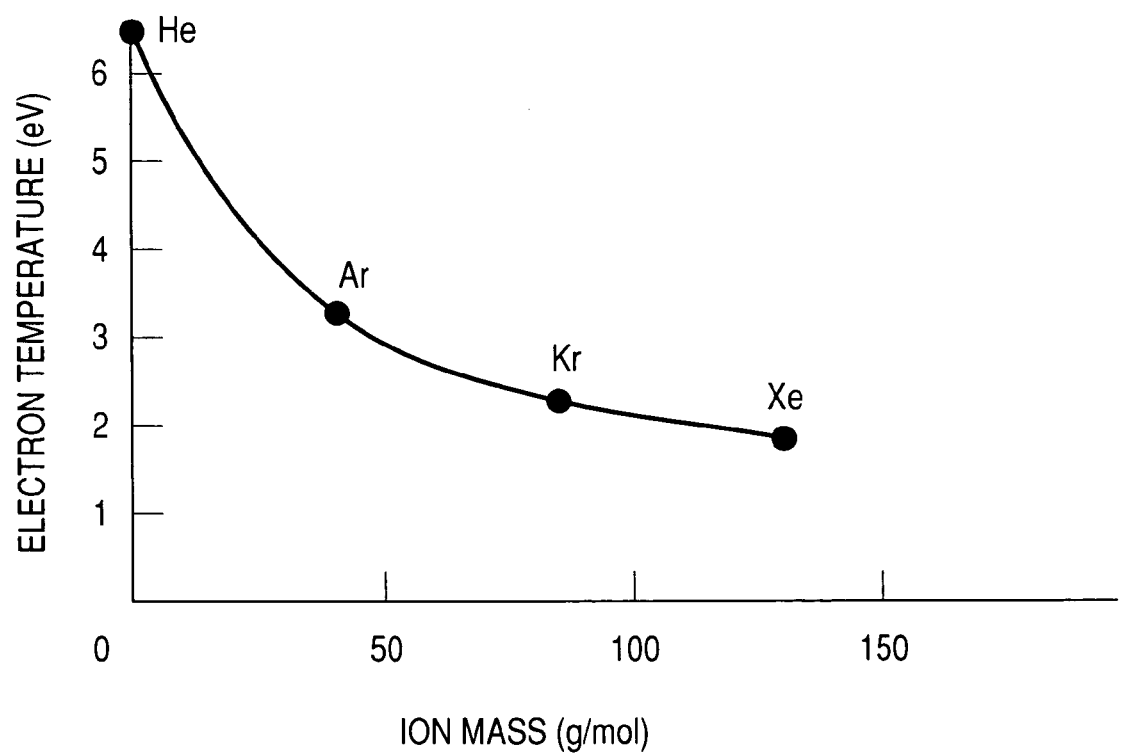
FIG. 3 is a graph showing a relation between rare gas species used in the present invention in etching of contact holes and electron temperatures.

FIG. 3 indicates a relation between rare gas species that are dilution gases for plasma gas used in etching of the silicon oxide film and electron temperatures. The gas condition was set to 500 ml/min for a rare gas, 30 ml/min for $C_4F_6$, 36 ml/min for $O_2$, and 200 ml/min for CO, and the gas pressure at that time was adjusted to 2 Pa. The radio frequency power used for plasma generation was constant in each condition, and it was 400 W under the present condition. When He with an ionization energy higher than that of Ar, which is the conventionally employed rare gas, is used, the electron temperature becomes higher. In contrast, when Xe with a lower ionization energy is used, the electron temperature becomes lower. The electron temperature is closely related to the degree of dissociation in the plasma, and the dissociation is depressed under the condition of a low electron temperature when Xe is used.

Figure 4A:
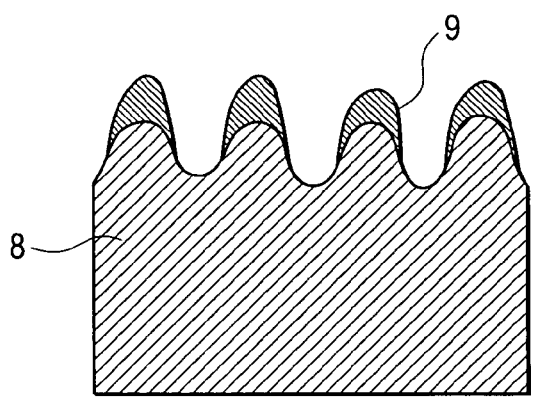
Figure 4B:
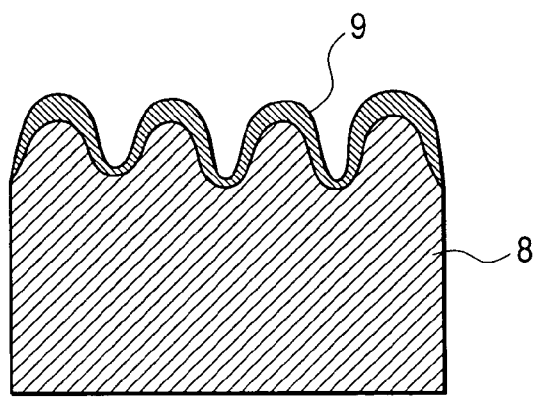
Figure 4C:
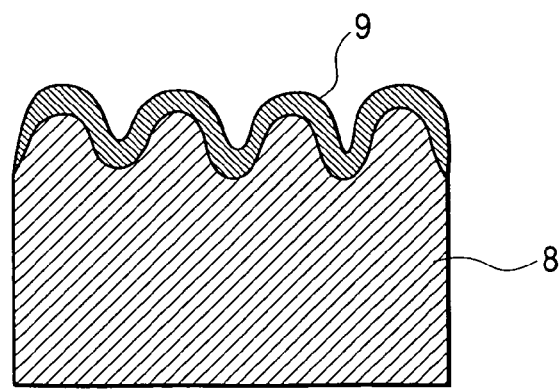

FIGS. 4A to 4C depict the appearances of CF polymer 9 deposited on a resist surface 8 depending on the rare gas species. FIG. 4A shows a case when He was used; FIG. 4B shows a case when Ar was used; and FIG. 4C shows a case when Xe was used. The use of He or Ar leads to enhanced gas dissociation, thereby making the ratio of C to F of the deposited CF polymer rich in C and the effective sticking coefficient high. Therefore, the CF polymer selectively deposits on the projected portions in the projections and depressions on the resist surface, with less deposit on the depressed portions. On the other hand, when Xe is used, the dissociation is suppressed, thereby allowing radicals represented by $CF_2$ to enter the surface in larger amounts and the ratio of C to F of the CF polymer to be controlled so as to be rich in F. Thus, the effective sticking coefficient can be kept low. In this case, the resist surface is uniformly coated with the polymer, as shown in FIG. 4C, thereby allowing damage to the resist to be suppressed in etching the silicon oxide film. On the other hand, when scattering due to ion species is taken into account, the scattering angle of He having a light mass becomes relatively broad compared to its incident angle, while Xe has a tendency of specular reflection. Namely, in contrast to the resist damage described above, Xe and Kr have a tendency of ion convergence, and resist damage is more readily transferred to a film to be processed when compared to He and Ar. Still further, the sputtering efficiency for the resist becomes higher as the ion mass becomes larger. In the vicinity of the sidewall of a resist pattern (generally called facet portion of resist), the amount of the polymer deposit is smaller, and, thus, the sputtering efficiency has a greater influence on the resist damage. From these points of view, the use of a mixed gas of Xe and Ar for the rare gas in processing the silicon oxide film allows resist damage, ion convergence, and sputtering efficiency to be compatibly suppressed. Thus, pitting and striations occurring after processing the silicon oxide film can be suppressed.

Second Embodiment

Figure 5A:
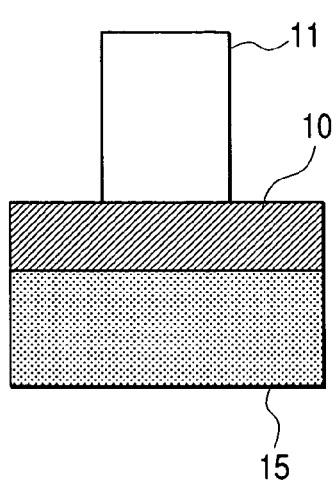
Figure 5B:
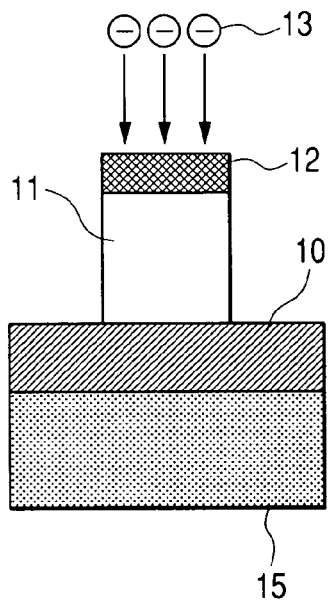
Figure 5C:
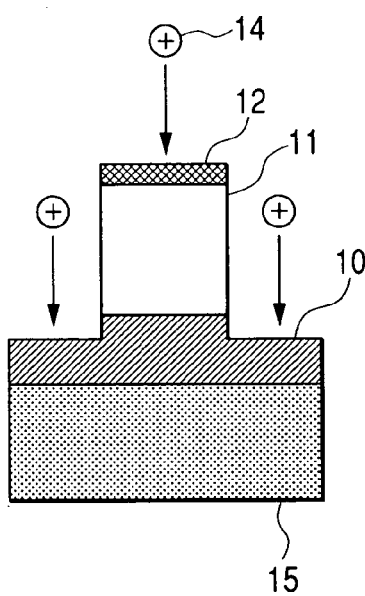
Figure 5D:
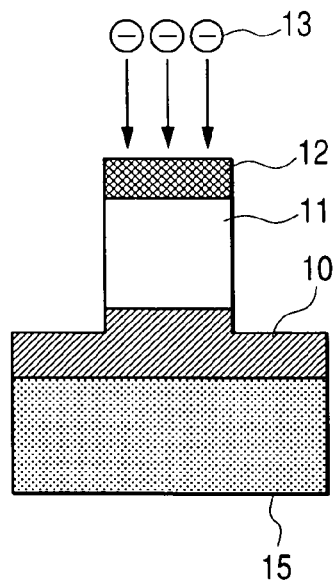
Figure 5E:
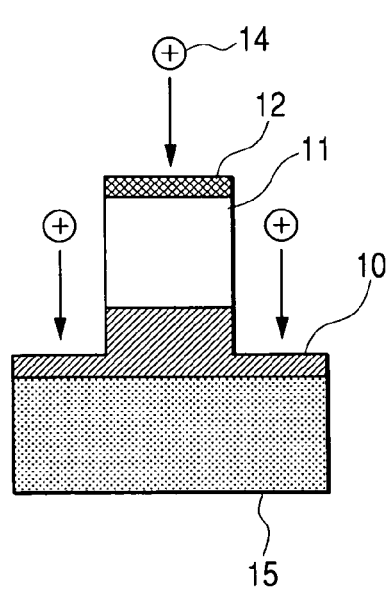

In this embodiment, resist modification and etching carried out in the same apparatus with the objective of reducing resist damage are exemplified. In general, resist modification is performed in a specifically designed modification apparatus, and then etching is performed in an etching apparatus. However, in the embodiment of the present invention, resist modification and etching are carried out by turns as shown by the steps of processing shown in FIGS. 5A to 5E. FIG. 5A is a cross sectional view before the processing, where an ArF resist 11, an anti-reflection coating 10, and a silicon oxide film 15 are laminated. FIGS. 5B and 5D depict resist modification cycles. A resist thickness 12 to be modified in one cycle of the resist modification is to be set larger than the resist thickness etched in the next etching cycle (FIGS. 5C and 5E). In this way, the resist surface is always modified at the time of etching, and resist damage can be reduced.

On the other hand, when the resist modification is carried out in a standalone apparatus, resist having an initial shape shown in FIG. 6A is wholly modified to provide the resist shown in FIG. 6B in the resist modification apparatus. By this modification, the lateral dimension of the resist is reduced, and when this resist is used as a mask for etching in an etching apparatus, a critical-dimension shift is generated, as shown in FIG. 6C, which creates a big problem in the electrical properties of a device. In the embodiment of the present invention, the resist is always modified by a thickness a little larger than that etched in the following etching cycle, thereby allowing the critical-dimension shift of the resist to be minimized. Thus, processing can be achieved with high precision. The resist modification and etching are carried out in the same apparatus in accordance with the present embodiment, thus contributing to a cost reduction of the apparatus and to a high throughput.

Figure 7:
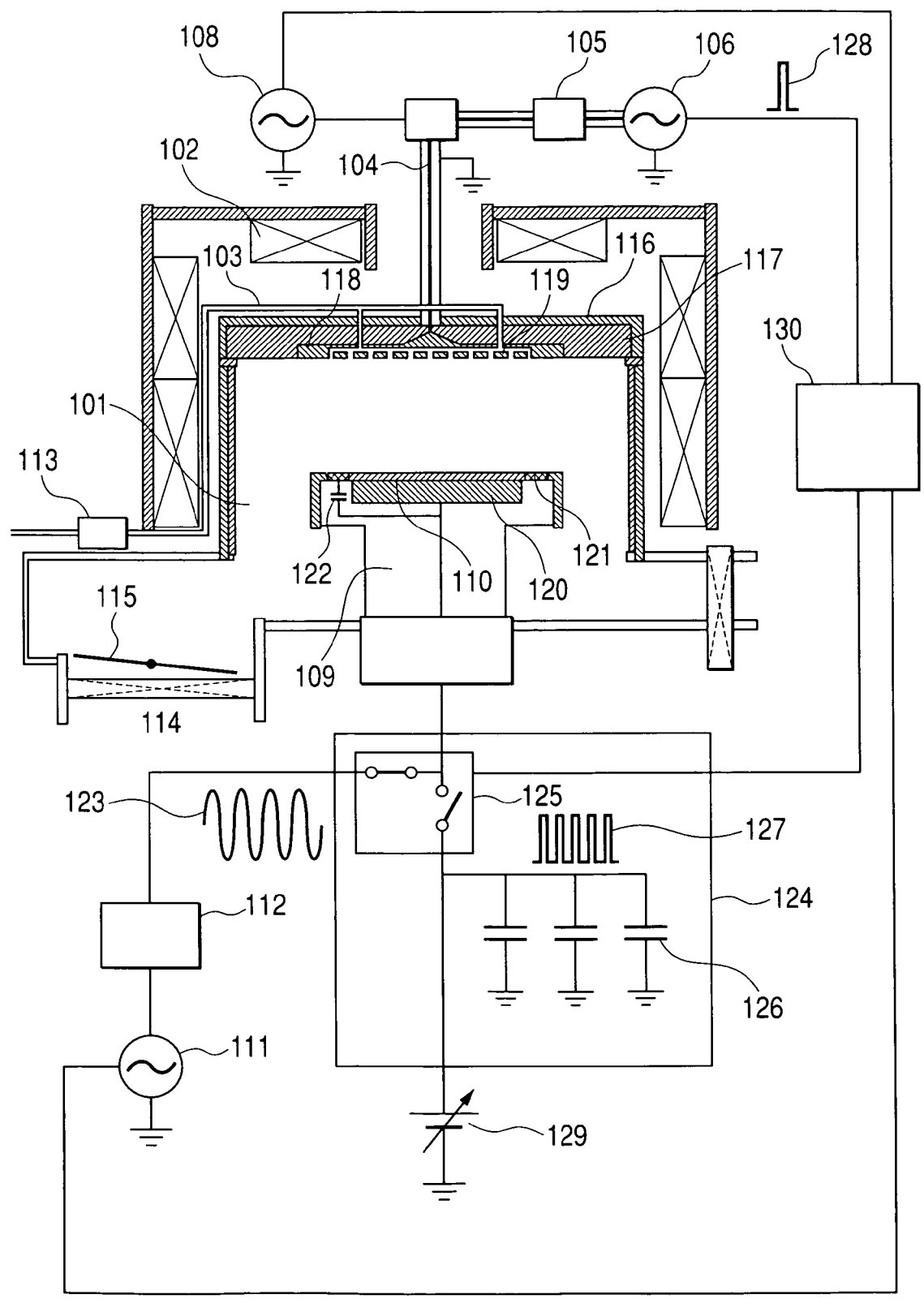
FIG. 7 is a schematic diagram of an etching apparatus that realizes a process to carry out resist modification and etching by turns according to the present invention.

Next, a case where an electron beam cure is used as a method of resist modification in the present embodiment will be explained. A schematic diagram of an apparatus used to realize the present embodiment is shown in FIG. 7. Although the mode of plasma generation is no object in the present embodiment, a case where a UHF-ECR plasma system is used will be explained in conjunction with the present embodiment.

A solenoid coil 102 is arranged around a vacuum chamber 101. A source gas is introduced into the vacuum chamber via a gas introduction tube 103. An electromagnetic wave generated by a 450 MHz power source 106 is supplied to an electromagnetic wave radiating antenna via a coaxial cable 104 and an impedance matching unit 105, generating a plasma through interaction with a magnetic field generated by the solenoid coil. The electromagnetic radiating antenna is provided with a 13.56 MHz power source 108 at the same time, thereby allowing an applied bias to be varied depending on the processes. In the vacuum chamber, a lower electrode 109 is provided, and a sample to be processed 110 is arranged thereon. To this lower electrode there is connected a mixing bias unit 124 that allows resist modification and etching to be carried out by turns. In the mixing bias unit 124, a high-speed switch 125 that switches between RF bias and pulse bias is installed. The mixing bias unit 124 and the high-speed switch 125 are placed in a single housing, and, further, the housing is grounded, although this is not shown. When ordinary etching is carried out, a radio-frequency bias power 123 of 800 KHz is supplied through a power source 111 and an impedance matching unit 112. In this case, the switch for RF bias supply is set to ON, and the other switch for the condenser side is set to OFF.

When resist modification is carried out, an electric charge stored in a condenser 126 is instantly supplied by switching on a switch connected to the condenser, thereby generating a positive pulse bias 127. In this case, the switch for the RF bias supply is kept OFF.

Figure 8A:
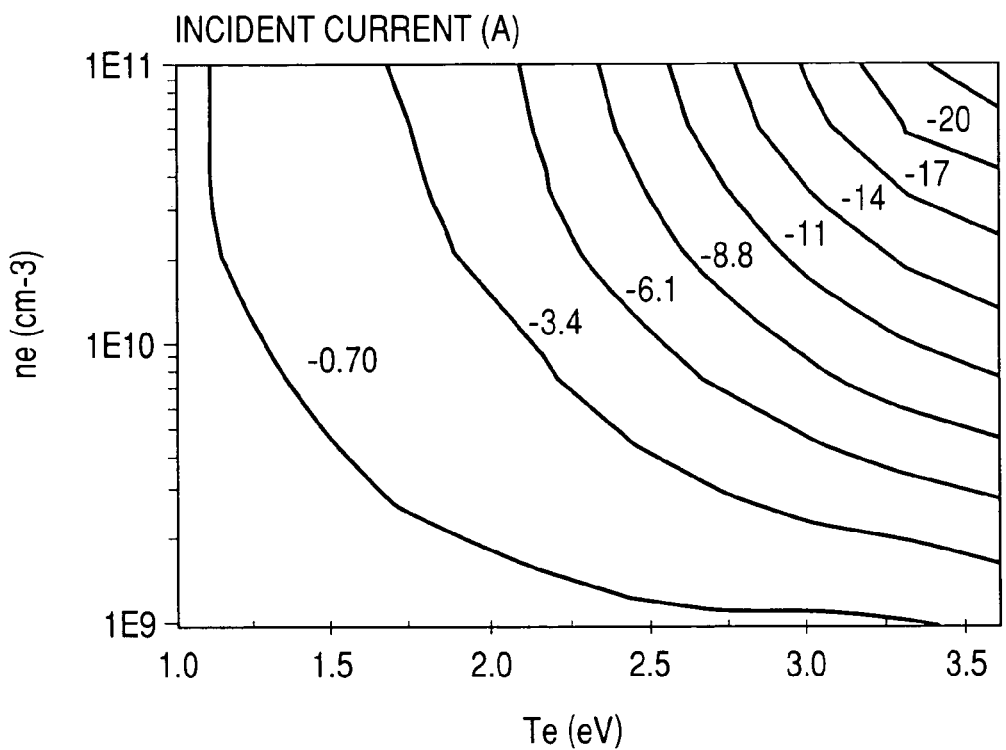
FIGS. 8A and 8B are graphs showing variables of electrons incident to the resist during the resist modification cycle according to the present invention, which are influenced by plasma density and electron temperature, where
Figure 8B:
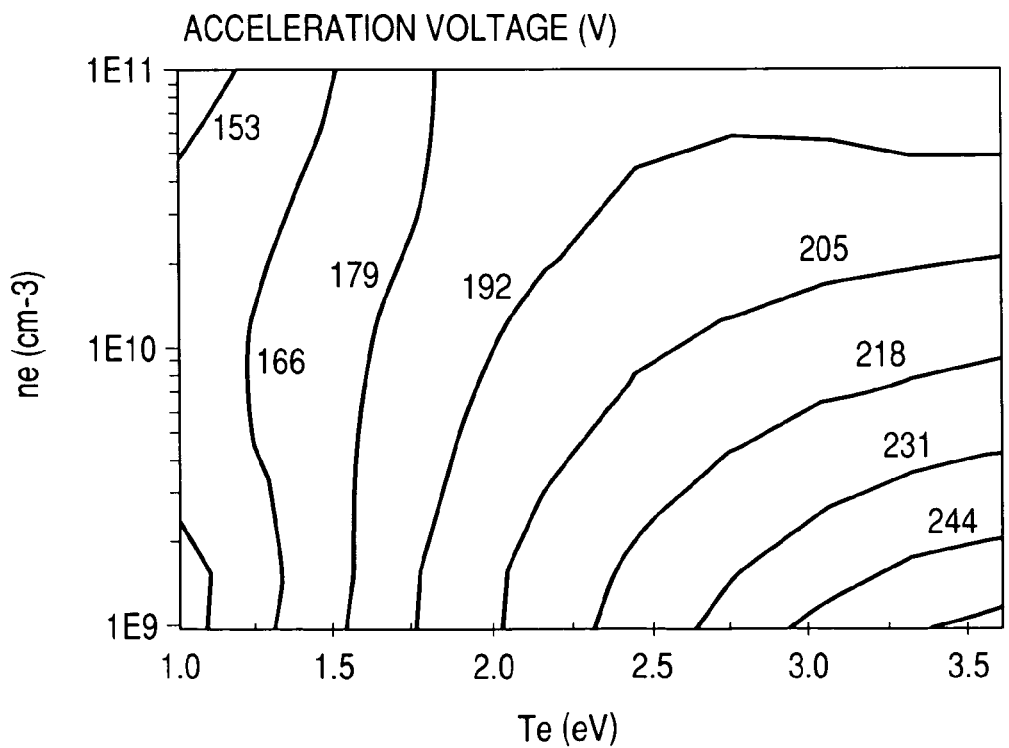

As shown by a simulation result depicted in FIGS. 8A and 8B, control of plasma density and electron temperature is required to efficiently apply the positive pulse bias to a wafer. As for the condition of plasma, a high electron temperature and a low density state are better for acquiring an acceleration energy of electrons, while a high electron temperature and a high density state are better for ensuring an electron current. In the present embodiment, pulse plasma was used as a means to control the plasma density at the time of applying the positive pulse bias. The 450 MHz power source 106 for plasma generation is pulse operated. During the cycle of the resist modification, the output of the 450 MHz power source is kept OFF. The ON and OFF operation of the 450 MHz power source 106 is input to the high-speed switch 125 as a trigger signal 128, and a delay time between the time of switching off and the time of applying the positive pulse bias is controlled, thereby allowing a desired plasma density to be acquired. In this way, electrons generated in the plasma are allowed to efficiently enter the surface of the wafer, and the resist surface can be modified.

It is extremely important to ensure an adequate electron dose in the electron beam cure. In the present embodiment, it is possible to deal with this by controlling the pulse numbers of the positive pulse bias applied to the wafer during the cycle of the resist modification. In this case, a resistance is provided on a transmission cable that connects a sample stage 120 and the grounded housing. Since the electric charge applied to the wafer leaks through the resistance, the time period between the start of application of one pulse bias and before applying a next pulse bias can be shortened. As a result, the maximum number of pulse biases during the cycle of the resist modification can be increased. On the other hand, it is necessary to control the pulse height of the positive pulse bias in order to control the acceleration energy of the electrons. This is enabled by controlling the output voltage of a direct power source 129 that supplies an electric charge to the condenser. The control operations described heretofore are all executed by a computer for control 130.

Figure 9:
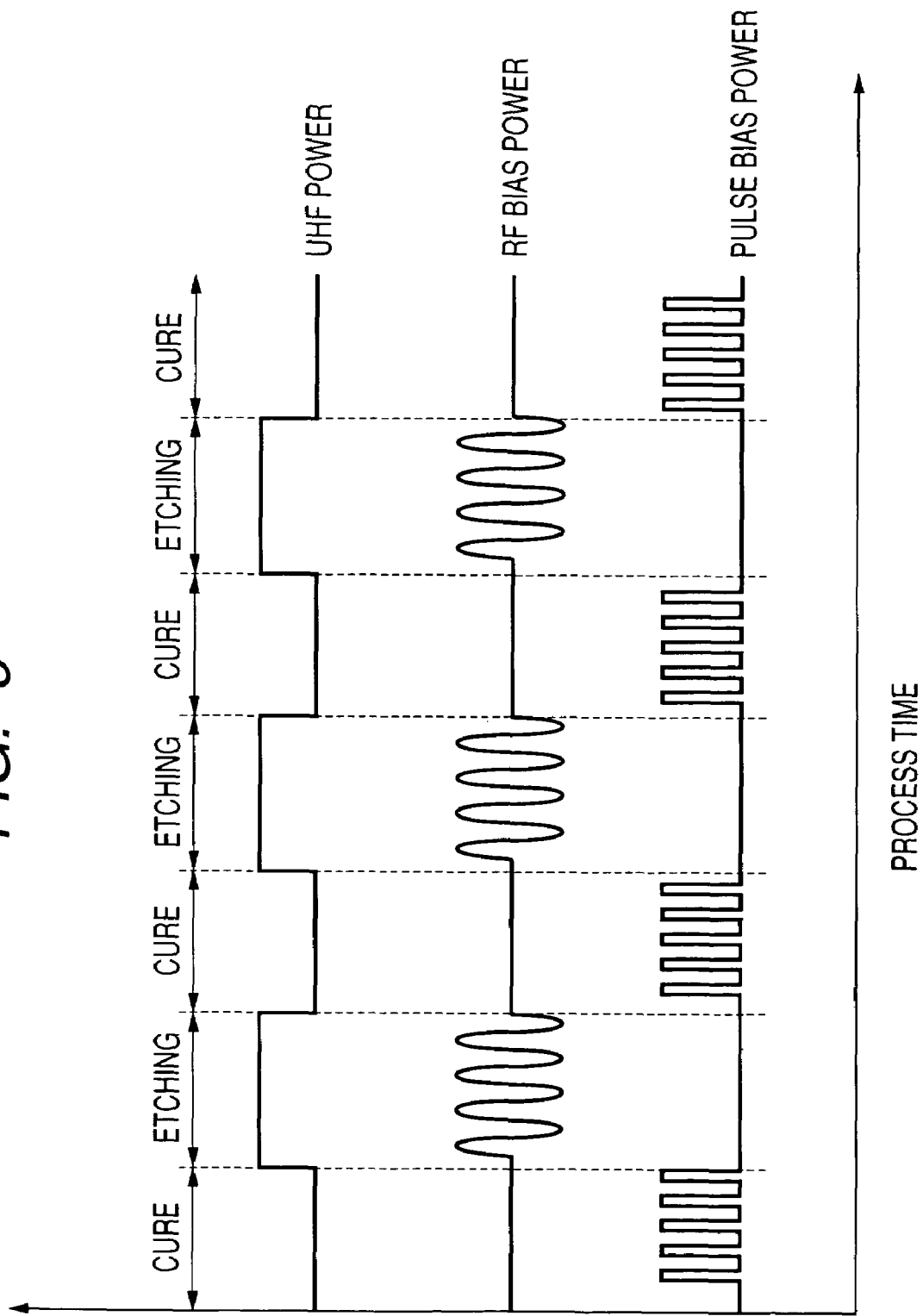
FIG. 9 is a process timing diagram of a sequence of the resist modification and etching according to the present invention.

In a practical process, the plasma condition for the cycle of the resist modification makes use of the same condition as that for the next coming etching cycle. For example, when the BARC processing and the resist modification are repeated, plasma is generated by introducing $CF_4$ at 125 ml/min. In order to conduct the resist modification by controlling the plasma density and thereby allowing electrons to efficiently enter the resist surface, the pulse bias is started to be applied 50 msec after switching off the plasma. Next, in the BARC etching cycle, the plasma gas is maintained as it is. In place of the pulse bias, an RF bias is applied this time to generate plasma, thereby allowing ions to enter the BARC surface. These steps are repeated by turns, as shown in FIG. 9. After the BARC processing is completed, the etching condition is changed to that suitable for the layer to be processed, and the resist modification cycle and the etching cycle are alternately carried out in a similar way. In this way, it becomes possible to perform etching of the layer to be processed using the ArF resist as a mask according to the present invention without producing pitting and striations.

The incident energy of electrons at the time of the surface modification of the resist is set between 10 V and 1 kV. The resist film thickness modified by the modification process of the resist surface at a time is controlled by the incident energy of electrons. This is possible because the mean-free-path of inelastic collision of electrons varies depending on the incident energy of electrons. The film thickness modified by the surface modification process at a time ranges from about several nm to 50 nm, and the modified film thickness falls within the above range as long as the incident energy of electrons is within the range from 10 V to 1 kV.

The plasma gas that can be suitably used at the time of modifying the resist surface is at least one of Ar, He, Xe, $N_2$, and Ne, or a mixed gas of at least one of Ar, He, Xe, $N_2$, and Ne, and at least one of $O_2$, $SF_6$, and $NF_3$. A deposition gas is not used for the plasma gas at the time of performing the surface modification of the resist, thereby allowing electrons to efficiently act on the resist and giving rise to a modification effect.

In the dry etching method and dry etching apparatus according to the present embodiment, the plasma density is controlled and a positive pulse bias is applied at the time of performing surface modification of the resist.

According to the above technique, the control of the plasma density makes it possible to control the plasma impedance and efficiently draw electrons. For example, a high electron temperature and a low plasma density are desirable for a plasma condition to acquire an incident energy of electrons, and a high electron temperature and a high plasma density are desirable for a plasma condition to acquire an electron current. Therefore, it is necessary to control the plasma density and electron temperature in order to efficiently allow the electron current to enter a wafer by the incident energy of electrons between 10 V and 1 kV. Specifically, the desirable plasma density lies between $10^9$ $cm^{-3}$ and $10^{11}$ $cm^{-3}$, and the desirable electron temperature lies between 1 eV and 4 eV.

Further, the dry etching method and dry etching apparatus according to the present embodiment is characterized in that the plasma density is controlled during the delay time from the time of switching off the high frequency power for plasma generation to the time of applying the positive pulse bias voltage, when the surface modification of the resist is carried out. According to the above technique, the plasma density can be easily controlled by performing pulse modulation of the high frequency power for plasma generation, and by applying positive pulse bias to the wafer after an arbitrary delay time from the time of switching off the power. Specifically, it is desirable to control the delay time between 10 msec and 500 msec. In this case, the etching process to be performed after the surface modification of the resist is carried out by switching on the high frequency power for plasma generation to generate a plasma and by applying the radio-frequency bias to the semiconductor substrate.

The application number of the positive pulse bias voltage that is applied at the time of the surface modification of the resist is desirably set to multi-pulses that are more than 10 pulses per one cycle. Although, depending on a plasma condition, it is generally difficult to ensure a necessary number of electrons (dose amount) in one pulse. Accordingly, in the process of the resist modification, it becomes possible to ensure a dose amount required for the resist modification by controlling the application number of the positive pulse bias applied to the semiconductor substrate after switching off the high frequency power for plasma generation.

Still further, the dry etching method and dry etching apparatus according to the present embodiment is characterized in that an inner conductor of the transmission cable that applies the radio-frequency bias and the positive pulse bias to the semiconductor substrate and a ground are connected via a resistance. According to the above technique, it becomes possible to release electric charges accumulated in one pulse in the semiconductor substrate and the transmission cable with a certain time constant and to prepare for the next pulse application by connecting the inner conductor and the ground via the appropriate resistance when the positive pulse bias is applied in multi-pulses during the process of the resist modification. In this way, the maximum pulse number applicable in one cycle can be increased.

Third Embodiment

In this embodiment, a process in which the second embodiment and the first embodiment described above are combined together will be explained. First, the resist modification of the resist surface layer is carried out by using the method of the electron beam cure that was explained in conjunction with the second embodiment. In this case, the plasma gas used to generate electrons is a rare gas that does not form deposition radicals and reactive radicals. In this way, electrons are purely drawn toward the resist surface, and the resist modification effect can be enhanced. In the present embodiment, Ar was supplied at 50 ml/min, and the pressure was set to 2 Pa. During the resist modification cycle, 15,000 pulses of positive pulse bias were applied 50 msec after switching off the plasma. The electron acceleration voltage is about 100 V, and the dose amount is about 2,000 $\mu C/cm^2$. The thickness of the resist modification is then about 10 to 20 nm. Subsequently, BARC processing was carried out by generating plasma of $CF_4$ alone as described with reference to the first embodiment without introducing Ar, and, thus, resist damage was suppressed. Further, pitting and striations due to resist damage can be significantly reduced by etching a silicon oxide film that is a layer to be processed with a mixed gas system of Xe, Ar, $C_4F_6$, $O_2$, and CO.

Fourth Embodiment

Figure 10:
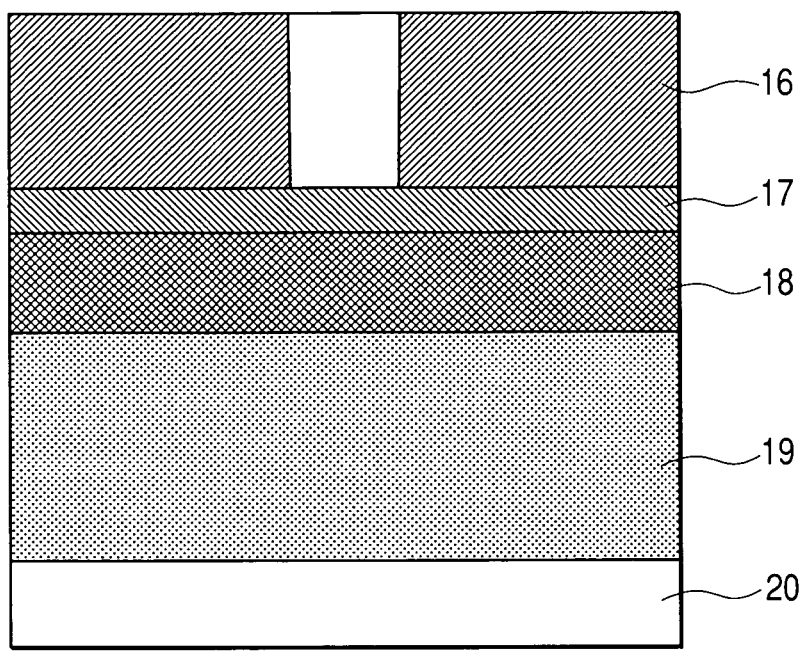
FIG. 10 is a diagrammatic cross sectional view of an embodiment of multi-layer resist processing according to the present invention.

A fourth embodiment is directed to a multi-layer resist processing that is one example of a method for lightening the load on an ArF resist. FIG. 10 is a cross sectional view of a sample used in the present embodiment, in which the structure of a multi-layer resist for patterning a novolac resin using an ArF resist pattern formed by lithography with an ArF excimer laser as a mask is shown. The film structure is composed of an ArF resist 16, BARC 17, SOG (Spin on glass) 18, novolac resin 19, and a layer to be processed 20. The present structure utilizes the novolac resin, which is excellent in etching resistance, as a mask for final etching of the layer to be processed. Accordingly, it is extremely important to transfer the pattern to the novolac resin with high precision without striations on the sidewalls of the pattern.

First, BARC processing is carried out under the etching condition of $CF_4$ alone, as explained in conjunction with the first embodiment. Thus, damage to the ArF resist after the BARC processing can be suppressed. Next, SOG processing is performed. Since the SOG is one of the silicon oxide films, etching is carried out with a gas system containing a fluorocarbon gas. For example, the gas system is a mixed gas of Xe, Ar, $C_5F_8$, and $O_2$. For the rare gas, it is also effective to use other rare gas system, such as Xe alone, Kr alone, a mixed gas of Kr and Xe, or a mixed gas of Kr and Ar. Then, the novolac resin is processed using as a mask the ArF resist, BARC, and SOG that remained after the SOG processing. In this case, $NH_4$ alone or a mixed gas of $N_2$ and $H_2$ is used.

Although the novolac resin processing with reduced damage to the ArF resist is completed as described above, it goes without saying that damage to the ArF resist may also be suppressed by employing the process of repeating the resist modification and etching that was explained in conjunction with the second embodiment. In this case, Ar alone may be used as a rare gas at the time of BARC and SOG processings. Moreover, it is needless to say that the present invention can be applied to damascene etching and self-align-contact etching, in addition to the multi-layer resist etching shown in conjunction with the present embodiment.

Fifth Embodiment

Figure 11:
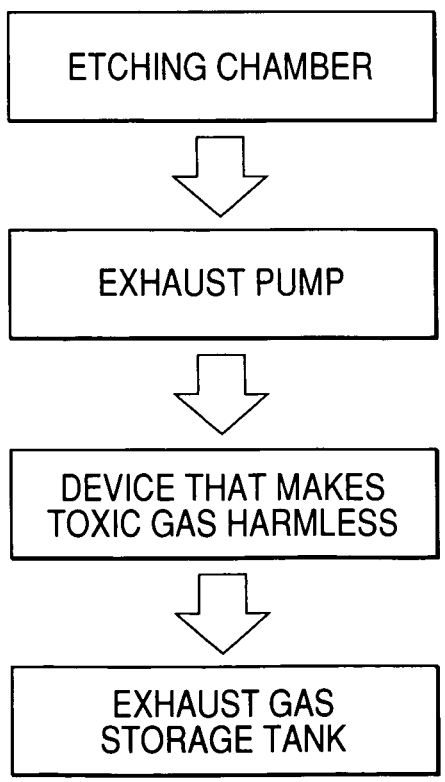
FIG. 11 is a diagram showing a process sequence in a case where an exhaust gas processing system is incorporated into an apparatus according to an embodiment of the present invention.

The present embodiment is directed to a case in which a recovery process system to recover exhaust gas is incorporated into the etching apparatus employed in the first to fourth embodiments. As explained in conjunction with the first embodiment, it is desirable to use a rare gas, such as Xe or Kr, as a dilution gas capable of reducing the electron temperature in order to suppress damage to an ArF resist in etching a silicon oxide film for processing contact holes and vias. However, the proportions of Xe and Kr present in the air are extremely low, and those gases are very expensive. Therefore, an exhaust gas storage tank was arranged at the final stage of the system, as shown in FIG. 11. The exhaust gas stored in the exhaust gas storage tank has been passed through an exhaust pump and a device that makes toxic gas harmless, and components such as halogenated gas, carbon monoxide gas, and fluorocarbon gas that adversely affect the human body and the environment have been removed from the exhaust gas. The recovered exhausted gas can be contracted out to a specialized recycling contractor, which allows Xe and Kr to be purified again. The cost of Xe and Kr can be reduced by introducing this system. At the same time, an etching process that is friendly to the natural environment can be constructed. Furthermore, the influence on productivity can be minimized by replacing this exhaust gas storage tank, for example, at the time of routine maintenance of the etching chamber.

What is claimed is:

1. A dry etching method comprising steps of:
   forming a layer to be processed via a single or plural film layers on a substrate;
   forming an organic anti-reflection-coating on the top film layer;

forming a pattern of a resist on the organic anti-reflection-coating, said resist containing C=O bonds and not more than 20% by weight ratio of benzene nucleus;

etching the organic anti-reflection-coating using the resist pattern as a mask, by using $C_xH_yF_z$ (x,z=1 to 10, y=0 to 10) plasma or a mixed plasma of Ar and $C_xH_yF_x$ (x,z=1 to 10, y=0 to 10); and etching the layer to be processed using the remaining film of the resist pattern as a mask, using a mixed plasma of Ar and $C_xH_yF_z$ (x,z=1 to 10, y=0 to 10), wherein said mixed plasma used for etching the organic anti-reflection-coating has a flow ratio of Ar which is not more than 10% relative to a total plasma gas flows, and wherein a gas containing iodine is added to the plasma gas for the layer to be processed.

2. The dry etching method according to claim 1, wherein the mixed gas used for etching the organic anti-reflection-coating additionally includes at least one of $N_2$, $O_2$, $SF_6$, $NF_3$, $H_2$, and $CH_4$.

3. The dry etching method according to claim 1, wherein a radio-frequency bias power applied to the substrate to be treated is set to 0.5 W/cm² or lower at the time of etching the organic anti-reflection-coating and the portion of the layer to be processed.

4. The dry etching method according to claim 1, wherein the layer to be processed is etched with a surface of the resist being modified at the time that the layer to be processed is etched.

5. The dry etching method according to claim 1, wherein the layer to be processed is etched without a surface of the resist being modified at the time that the layer to be processed is etched.

6. The dry etching method according to claim 1, wherein the organic anti-reflection-coating is etched using said mixed plasma.

7. A dry etching method comprising steps of:
forming a layer to be processed via a single or plural film layers on a substrate;
forming an organic anti-reflection-coating on the top film layer;
forming on the organic anti-reflection-coating a pattern of a resist containing C=O bonds and not more than 20% by weight ratio of benzene nucleus that represents a resist material used in ArF lithography;
etching the organic anti-reflection-coating using the resist pattern as a mask;
performing surface modification of the resist pattern by applying a pulse bias to the substrate; and
etching the layer to be processed using the remaining film of the resist and the organic anti-reflection-coating as a mask.

8. The dry etching method according to claim 7, wherein the step of performing the surface modification of the resist and the steps of etching the organic anti-reflection-coating and the layer to be processed are carried out in the same apparatus.

9. The dry etching method according to claim 7 or 8, wherein the surface modification is carried out with electron beam irradiation.

10. The dry etching method according to claim 7 or 8, wherein an average film thickness etched at the step of etching the organic anti-reflection-coating or the layer to be processed is thinner than the thickness modified by the surface modification.

11. A dry etching method comprising steps of:
forming a layer to be processed via a single or plural film layers on a substrate;
forming an organic anti-reflection-coating on the top film layer;
forming a pattern of resist on the organic anti-reflection-coating, said resist containing C=O bonds and not more than 20% by weight ratio of benzene nucleus;
etching the organic anti-reflection-coating using the resist pattern as a mask; and
etching the layer to be processed using the remaining film of the resist pattern as a mask,
wherein a mixed gas of Ar with a flow ratio of not more than 10% relative to a total plasma gas flow and $C_xH_yF_z$ (x,z=1 to 10, y=0 to 10) is used as the plasma gas for etching the organic anti-reflection-coating and a portion of the layer to be processed, and
wherein a step of reducing roughness of the resist surface by gas plasma containing F, O, and N is included after etching the organic anti-reflection-coating or the layer to be processed.

12. A dry etching method comprising steps of:
forming a layer to be processed via a single or plural film layers on a substrate;
forming an organic anti-reflection-coating on the top film layer;
forming on the organic anti-reflection-coating a pattern of a resist containing C=O bonds and not more than 20% by weight ratio of benzene nucleus that represents a resist material used in ArF lithography;
etching the organic anti-reflection-coating using the resist pattern as a mask; and
etching the layer to be processed with any one of Xe, Kr, a mixed gas of Ar and at least one of Xe and Kr, and a mixed gas of Xe and Kr is used as a dilution gas using the remaining film of the resist pattern as mask,
wherein a mixed gas of Ar with a flow ratio of not more than 10% relative to a total plasma gas flow and $C_xH_yF_z$ (x,z=1 to 10, y=0 to 10) that represents a fluorocarbon gas is used as the plasma gas for etching the organic anti-reflection-coating and a portion of the layer to be processed, and
wherein an exhaust gas is recovered after etching the layer to be processed.

13. The dry etching method according to claim 12, wherein Xe and Kr are extracted from the recovered exhaust gas.

14. A dry etching method comprising steps of:
forming a layer to be processed via a single or plural film layers on a substrate;
forming an organic anti-reflection-coating on the top film layer;
forming a pattern of a resist on the organic anti-reflection coating, said resist containing C=O bonds and not more than 20% by weight ratio of benzene nucleus;
etching the organic anti-reflection-coating using the resist pattern as a mask; and
etching the layer to be processed using the remaining film of the resist pattern as a mask;
wherein a mixed gas of Ar with a flow ratio of not more than 10% relative to a total plasma gas flow and $C_xH_yF_z$ (x,z=1 to 10, y=0 to 10) is used as the plasma gas for etching the organic anti-reflection-coating and a portion of the layer to be processed, and
wherein a gas containing iodine is added to the plasma gas for the layer to be processed.

* * * * *